United States Patent
Nair

(10) Patent No.: US 6,958,632 B2
(45) Date of Patent: *Oct. 25, 2005

(54) SYMMETRIC VOLTAGE FOLLOWER BUFFER

(75) Inventor: Rajendran Nair, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/665,300

(22) Filed: Sep. 17, 2003

(65) Prior Publication Data

US 2004/0061535 A1 Apr. 1, 2004

Related U.S. Application Data

(63) Continuation of application No. 09/608,086, filed on Jun. 30, 2000, now Pat. No. 6,717,445.

(51) Int. Cl.$^7$ ................................................. H03B 1/00
(52) U.S. Cl. ......................... 327/112; 327/391; 326/83
(58) Field of Search ................................. 327/108, 112, 327/170, 379, 389, 391; 326/22–24, 26, 27, 83, 86

(56) References Cited

U.S. PATENT DOCUMENTS

| | | | |
|---|---|---|---|
| 5,488,322 A | 1/1996 | Kaplinsky | 327/108 |
| 5,585,744 A * | 12/1996 | Runas et al. | 326/86 |
| 5,644,255 A * | 7/1997 | Taylor | 326/86 |
| 5,959,475 A | 9/1999 | Zomorrodi | 327/112 |
| 6,031,389 A | 2/2000 | Fotouhi et al. | 326/83 |
| 6,140,841 A | 10/2000 | Suh | 326/60 |

* cited by examiner

*Primary Examiner*—Long Nguyen
(74) *Attorney, Agent, or Firm*—Blakely, Sokoloff, Taylor & Zafman LLP

(57) ABSTRACT

A circuit including a signal input to receive a signal, a buffer circuit to receive the input signal and to generate a buffer circuit output, and a voltage following circuit to receive the signal input and to generate a voltage following output. The buffer circuit output and the voltage following circuit output are coupled to a circuit output node.

12 Claims, 7 Drawing Sheets

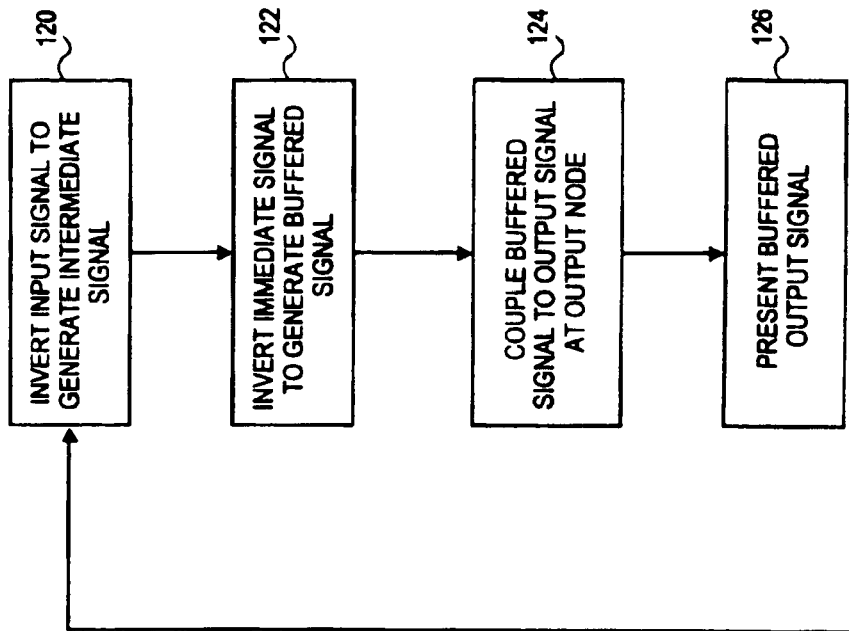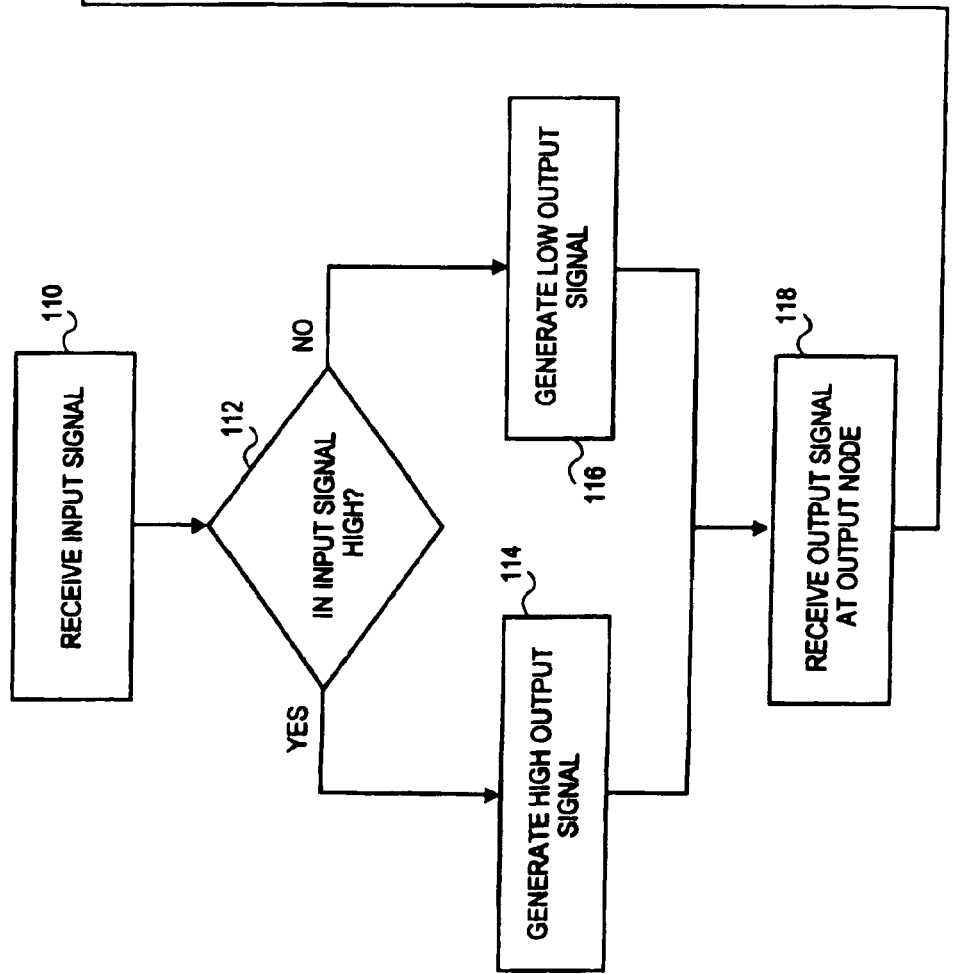
FIG. 1

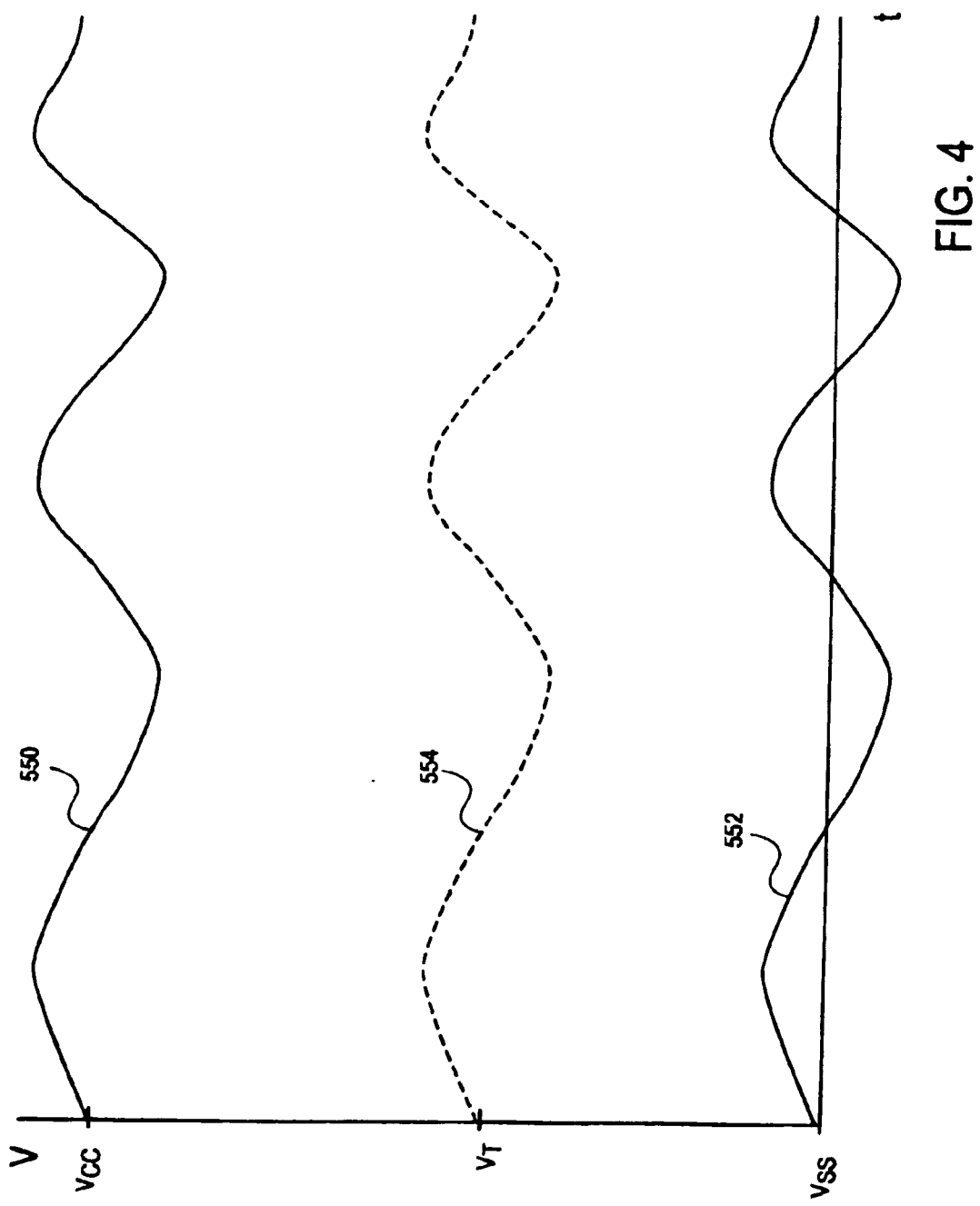

SYMMETRIC VOLTAGE FOLLOWER BUFFER

RELATED APPLICATIONS

This application is a continuation of U.S. patent application Ser. No. 09/608,086, filed on Jun. 30, 2000 now U.S. Pat. No. 6,717,445, entitled Symmetric Voltage Follower Buffer, assigned to the corporate assignee of the present invention.

FIELD OF THE INVENTION

The present invention pertains to the field of electronic circuits. More particularly, the present invention relates to the design of buffer circuitry.

BACKGROUND OF THE INVENTION

Typical clock distribution paths in large (in terms of die area) microprocessors consist of buffer stages that transmit the clock from the point of generation to the multiple points of consumption. The points at which the clock signal is utilized may be very large in number, and thus the clock load may be quite large. A typical distribution expands out in a tree-like structure with multiple buffer stages utilized in the transmission of the clock. Each buffer stage is typically implemented as a combination of a receiving and a driving CMOS inverter. CMOS inverters are known to be very susceptible to power supply noise in determining the relationship between the input and the output.

In digital circuits, power supply noise may produce timing errors or, in extreme cases, glitches and incorrect recognition of logic levels of circuits. Noise on real voltages, for example, result in the transient shift of the threshold levels of digital CMOS circuits, such as inverters or other level sensitive circuit elements, resulting in an earlier or later recognition of incoming signals.

In specific circuit implementations, such as clock distribution paths, noise on real voltages is the primary cause of timing error in the generation of clock waveforms, and the consequence of noise is termed clock jitter. Clock jitter may be a performance limiter in high-speed microprocessor circuits. Jitter is not predictable in an accurate manner without exhaustive circuit simulations of the complete structural description (transistors/device level description) of the full-chip database to determine the actual noise content in the power supplies both spatially and temporarily. Clock jitter is accounted for in the design of microprocessor circuits by allocating a certain amount of time, or design margin for cycle-to-cycle jitter, taken out of available cycle time (the period of the clock signal at which the core of the processor functions). This therefore results in less time available for logic computations within a clock cycle.

A typical CMOS inverter consists of a PMOS transistor and an NMOS transistor connected in series between power supply rails, with the source of the PMOS transistor connected to the higher voltage rail and the source of the NMOS transistor connected to the lower voltage rail. The gate terminals of both devices are connected together to the input signal, and the drain terminals of both devices are tied together to the output node.

The threshold voltage of the typical CMOS inverter (defined as the intersection voltage level between the input and the output) depends upon the relative strength of the devices as well as the applied supply differential. Given that the strengths of the two complementary devices (the PMOS transistor and the NMOS transistor) are matched, the threshold of the circuit is nominally at the half-wave level between the potentials of the two supply rails, Vcc and Vss. Noise imposed on the power supplies that change the relationship between Vcc and Vss during any input transitions also changes the time delay from the input to the output, introducing what is termed jitter. A typical clock buffer stage consists of two cascaded inverter stages, with each stage contributing to the total clock jitter.

BRIEF DESCRIPTION OF THE DRAWINGS

The present invention is illustrated by way of example and not limitation in the figures of the accompanying drawings, in which like references indicate similar elements and in which:

FIG. 1 is a flow diagram of the operation of one embodiment of a symmetric voltage follower buffer circuit;

FIG. 4 is a graphical representation of power supply noise;

DETAILED DESCRIPTION

Figure 2:
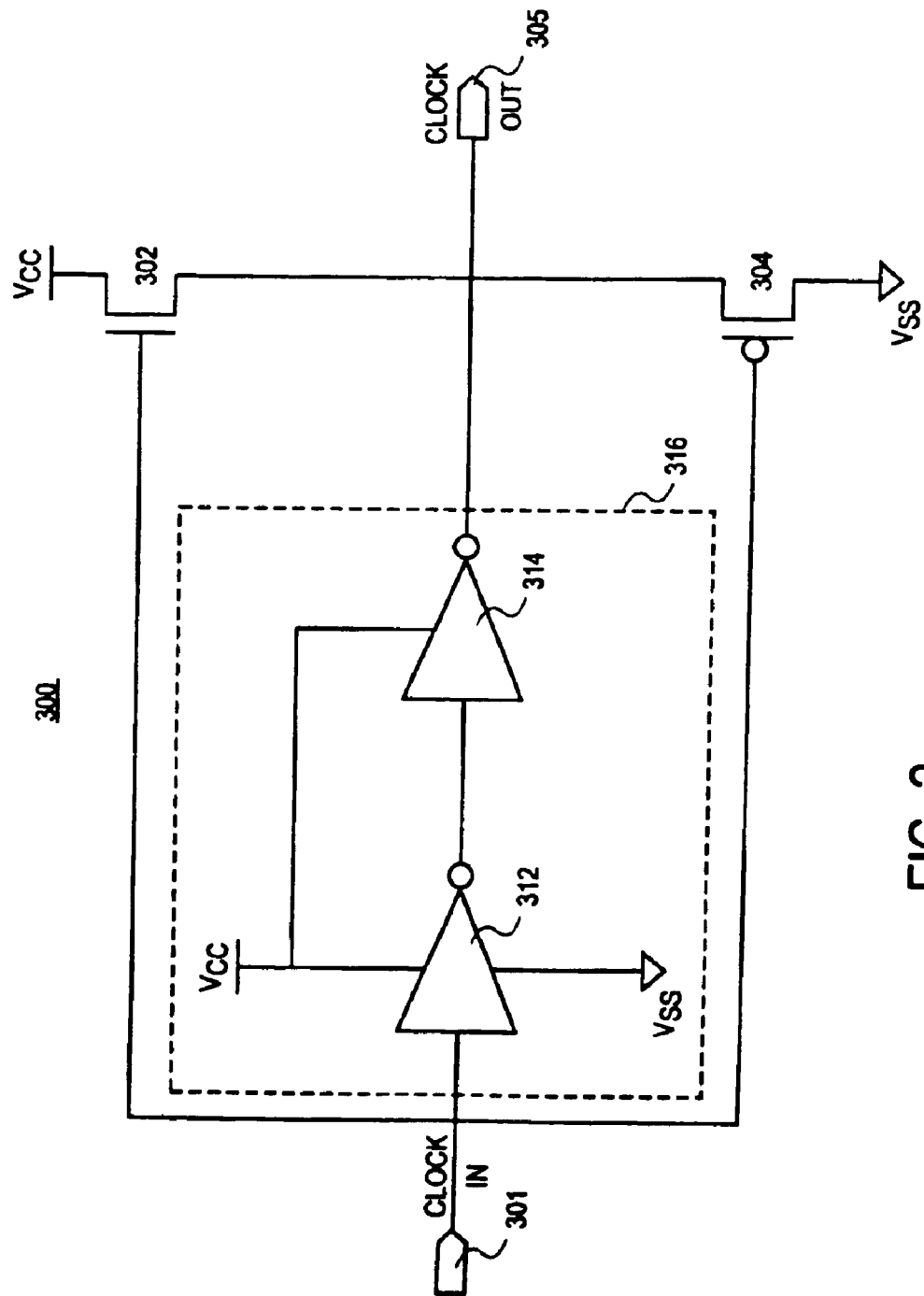
FIG. 2 is a circuit diagram of an embodiment of a symmetric voltage follower buffer.

A method and apparatus for a buffer are described. The invention has reduced clock jitter. Because of the reduced clock jitter, more time is available for logic computations within a clock cycle.

FIG. 1 is a flow diagram of the operation of a symmetric voltage follower buffer circuit, according to one embodiment. An input signal is received 110 by the symmetric voltage follower buffer circuit. The input signal may be any type of signal, such as, for example, a clock signal or a data signal. The input signal is checked to see if the signal is high 112. If the input signal is high, a high output signal is generated 114. If the input signal is not high, a low output signal is generated 116. The output signal 114, 116 is received at an output node 118.

The input signal 110 is also inverted to generate an intermediate signal 120. The intermediate signal 120 is then inverted to generate a buffered signal 122. The buffered signal is coupled to output signal at the output node 124. The buffered output signal is presented as the output 126. It will be understood that all of the processes described are not necessary for the operation of the present invention.

FIG. 2 is a circuit diagram of an embodiment of a symmetric voltage follower buffer. Symmetric voltage follower buffer 300 includes transistors 302, 304, input 301, a buffer 316 and a output node 305. Input node 301 may receive any type of signal such as, for example, a clock signal or a data signal.

Transistor 302 is a n-type transistor and transistor 304 is a p-type transistor. The n-type transistor may be a NMOS transistor and the p-type transistor may be a PMOS transistor, in one embodiment. The drain of transistor 302 is connected to a positive power supply Vcc. The drain of transistor 304 is connected to a less positive power supply than Vcc, designated as Vss. Vss may be 0 volts. The source of transistor 302 is connected to the source of transistor 304. The source of transistor 302 and the source of transistor 304 are both coupled to the output node 305.

Buffer 316 includes two inverters 312, 314. The input of inverter 312 receives the input signal 301. The output of inverter 312 is connected to the input of inverter 314. The output of inverter 314 is coupled to the output node 305.

The gates of transistors 302, 304 are connected to the input signal 301. Because the n-type transistor 302 has its drain connected to Vcc, when the input signal is high, the output signal 305 will also be high. A high input signal 301 will turn on transistor 302 causing output node 305 to be charged up. However, the output node will only be charged up to Vcc−Vtn (the threshold for the n-type transistor 302). Once the output node 305 reaches Vcc−Vtn, the n-type transistor 302 will cut off because the gate to source voltage of the n-channel transistor 302 must be greater than the threshold voltage Vtn for the transistor 302 to remain on.

A low input signal will turn on transistor 304, discharging the output node 305. Because the source to gate voltage of transistor 304 must be greater than a threshold voltage Vtp, the output node 305 will only discharge to Vss+Vtp.

The timing of the output signal 305 will be less dependent on the power supply, and more dependent on the input signals 301, since transistor 302 will be turned on when the input signal 301 reaches Vtn and transistor 304 will be turned on when the input signal 301 goes below the threshold voltage of transistor 304, Vtp.

Buffer circuit 316 allows the symmetric voltage follower buffer circuit 300 to have a full swing signal output since inverters 312 and 314 are configured in the typical manner (i.e., with the source of p-type transistor connected to Vcc and the source of n-type transistor connected to Vss). When the output node 305 reaches Vcc (or gets within Vtn of Vcc) due to buffer circuit 316, n-type transistor 302 will be cut off since the gate to source voltage will be below Vtn. When the output node 305 reaches Vss (or gets within Vtp of Vss) due to buffer circuit 316, p-type transistor 304 will be cut off since the source to gate voltage will be below Vtp.

Figure 3:
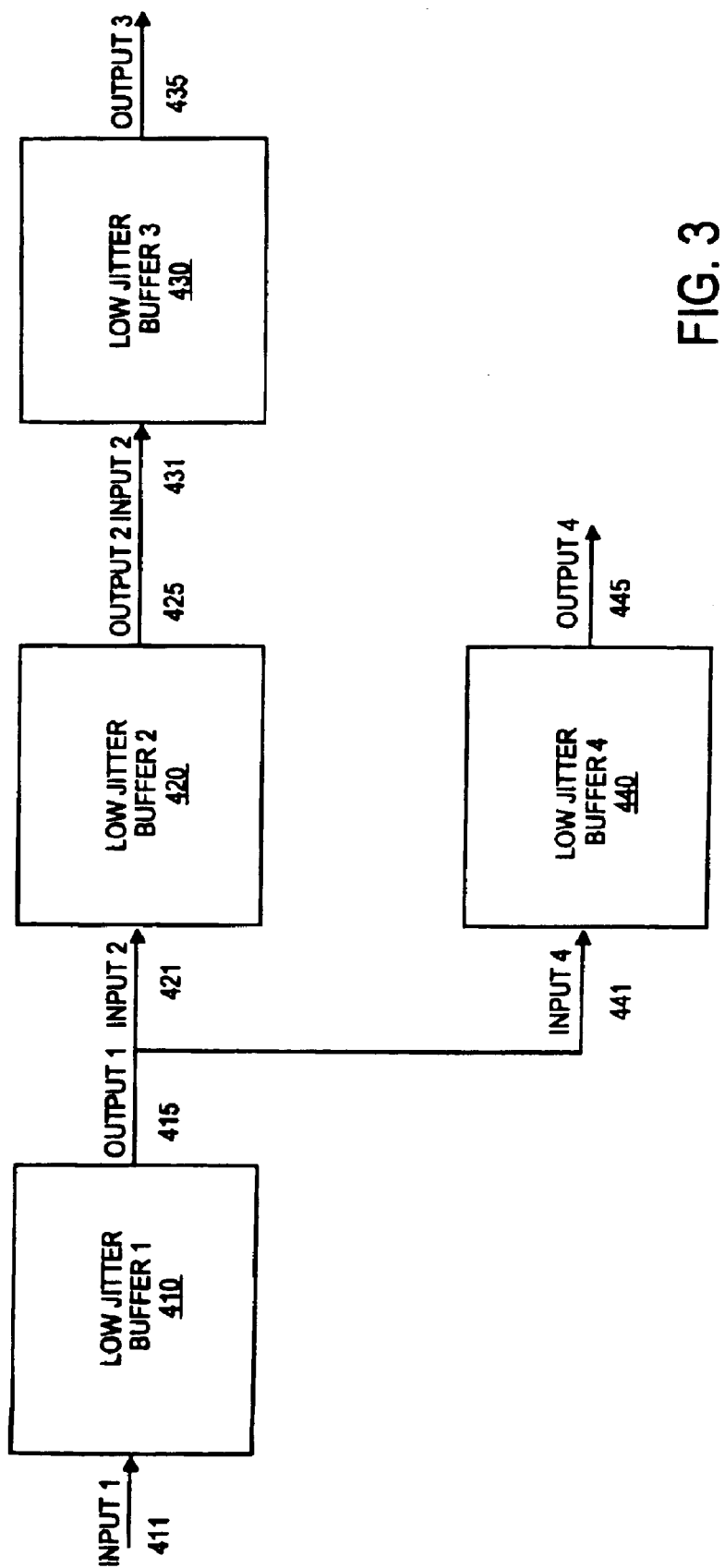
FIG. 3 is a block diagram of cascaded symmetric voltage follower buffer circuits.

FIG. 3 is a block diagram of cascaded symmetric voltage follower buffer circuits. Cascaded symmetric voltage follower buffer circuit 400 includes symmetric voltage follower buffer circuits (or low jitter buffer circuits) 410, 420, 430, 440.

Low jitter buffer 1 410 receives an input signal 1 411. Low jitter buffer 1 410 outputs an output signal 415 1. An output signal 1 415 is received by low jitter buffer 2 420 as input signal 2 421 and by low jitter buffer 4 440 as input signal 4 441. Low jitter buffer 2 420 outputs output signal 2 425 and low jitter buffer 4 440 outputs output signal 4 445. Output signal 2 425 is input into low jitter buffer 3 430 as input signal 3 431. Low jitter buffer 3 430 then outputs output signal 3 435. It will be understood that cascaded symmetric voltage follower buffer circuit 400 is merely illustrative and not an accurate representation of the number of buffer stages utilized in the transmission of clocks or signals.

FIG. 4 is a graphical representation of power supply noise. Line 550 represents positive power supply signal Vcc. Less positive power supply voltage Vss is represented by line 552 and the inverter switching threshold voltage, Vtinv, is represented by line 554. As illustrated in FIG. 5, although the relationship between Vcc and Vss may not change (i.e., Vcc−Vss stays the same), Vtinv will change in value. This change in Vtinv may lead to changes in the timing relationship between the input and the output of a buffer circuit.

In typical CMOS logic gates, there is a clear correspondence between the output timing and power supply noise since the output is directly related to voltage levels of power supplies connected to the circuit. Thus, clock jitter caused by power supply noise in one buffer stage will be magnified as the clock signal is distributed or transmitted through multiple buffer stages.

Figure 5A:
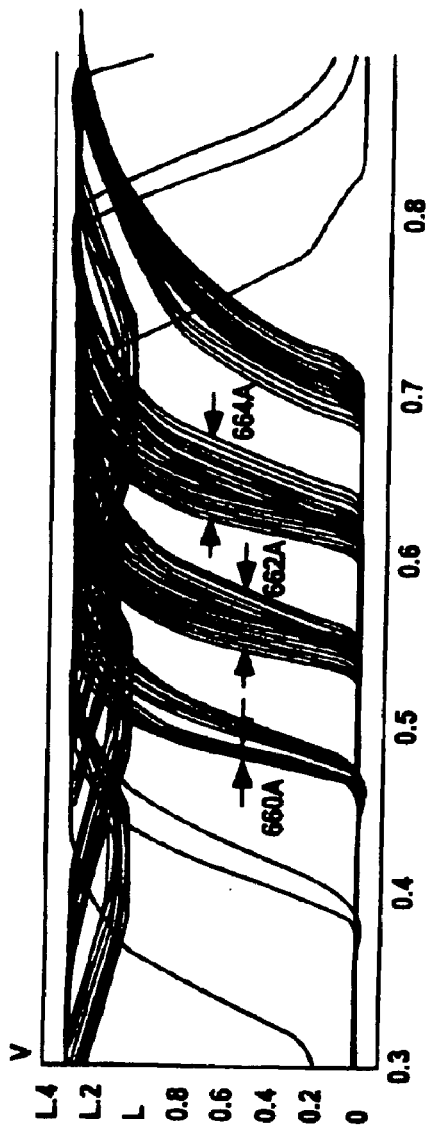
FIG. 5a is a graphical representation of jitter in a typical cascaded buffer circuit.
Figure 5B:
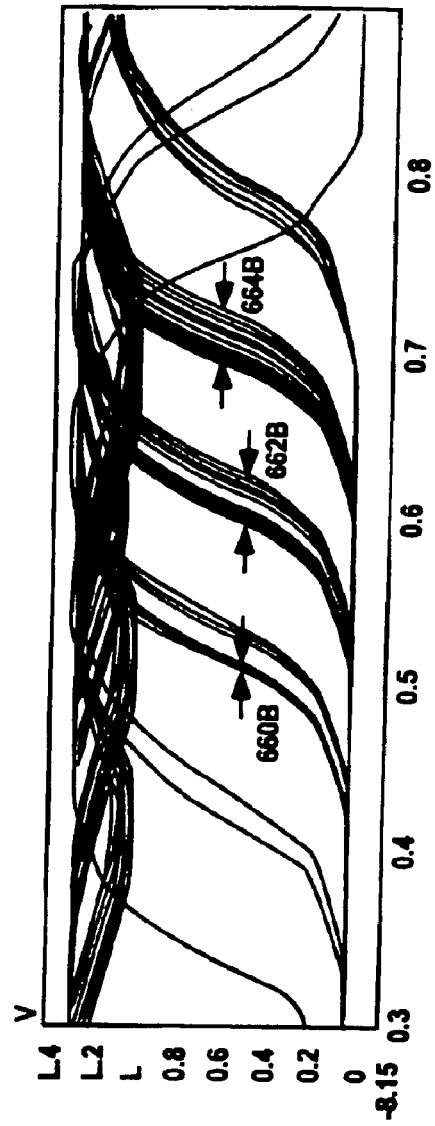
FIG. 5b is a graphical representation of jitter in the cascaded symmetric voltage follower buffer circuit.

FIG. 5a is a graphical representation of jitter in a typical cascaded buffer circuit. FIG. 5b is a graphical representation of jitter in the cascaded symmetric voltage follower buffer circuit.

In FIG. 5a, the growing amount of timing uncertainty 660A, 662A, 664A is shown for outputs of cascaded buffers. As the timing uncertainty of the output of each cascaded buffer grows, for example 660A, the timing uncertainty in the input of the next buffer increases, leading to a larger increase in the timing uncertainty 662A of the output of the next buffer.

FIG. 5b illustrates that the output uncertainty is improved 660B, 662B, 664B for the cascaded symmetric voltage follower buffers. It is observed that the increase in output timing uncertainty 660B, 662B, 664B for the cascaded symmetric voltage follower buffers is significantly smaller as compared with the output timing uncertainty 660A, 662A, 664A of the typical cascaded buffers. In one embodiment, output timing uncertainty, or clock jitter, was lowered by more then 50%.

Figure 6:
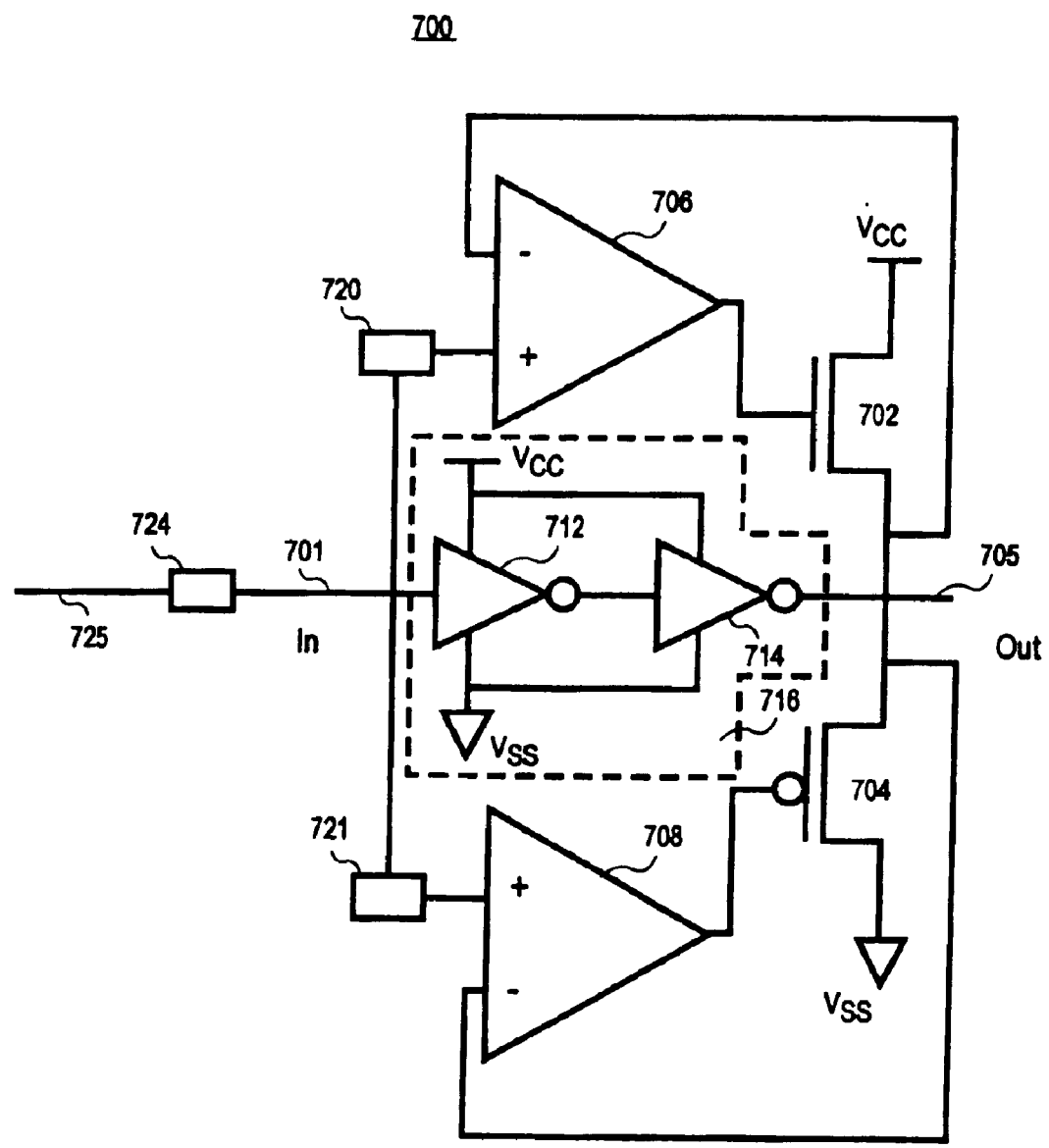
FIG. 6 is a circuit diagram of a preferred embodiment of a symmetric voltage follower buffer.

FIG. 6 is a circuit diagram of a preferred embodiment of a symmetric voltage follower buffer. Symmetric voltage follower buffer 700 includes transistors 702, 704, amplifiers 706, 708, input 701, a buffer 716 and a output node 705. Input node 701 may receive any type of signal such as, for example, a clock signal or a data signal.

Transistor 702 is a n-type transistor and transistor 704 is a p-type transistor. The drain of transistor 702 is connected to a positive power supply Vcc. The drain of transistor 704 is connected to a less positive power supply then Vcc, designated as Vss. Vss may be 0. The source of transistor 702 is connected to the source of transistor 704. The source of transistor 702 and the source of transistor 704 are both coupled to the output node 705.

Amplifiers 706, 708 drive the input signal. A first amplifier 706 includes a positive input, a negative input and an output. The positive input of the first amplifier 706 is coupled to the input signal 701. The output of amplifier 706 is coupled to the gate of transistor 702. The negative input of amplifier 706 is coupled to the source of transistor 702 to provide negative feedback.

A second amplifier 708 includes a positive input, a negative input and an output. The positive input of the second amplifier 708 is coupled to the input signal 701. The output of amplifier 708 is coupled to the gate of transistor 704. The negative input of amplifier 706 is coupled to the source of transistor 704 to provide negative feedback.

The use of amplifiers 706, 708 reduces power supply dependence further in comparison to the symmetric voltage follower buffer of FIG. 3. The amplifiers 706, 708 are used as control devices that ensure that the output follows the received input accurately.

The output of amplifier 706 follows the input signal. Thus, when the input signal is high, the output signal 705 will also be high. A high input signal 701 will cause the output of amplifier 706 to be high, which will turn on transistor 702. Since the drain of transistor 702 is connected to Vcc, the output node 705 will be charged up. However, the output node will only be charged up to Vcc−Vtn (the threshold for the n-type transistor 702). Once the output node 705 reaches Vcc−Vtn, the n-type transistor 702 will cut off because the gate to source voltage of the n-channel transistor 702 must be greater than the threshold voltage Vtn. The source voltage of transistor 702 will be fed back to the negative input of the first amplifier 706, stabilizing the output of amplifier 706 and lowering dependence of the output on the power supply.

A low input signal will cause the output of amplifier 708 to be low. The low output of amplifier 708 will turn on transistor 704, discharging the output node 705. Because the source to gate voltage of transistor 704 must be greater than a threshold voltage Vtp, the output node 705 will discharge to Vss+Vtp. The source voltage of transistor 704 will be fed back to the negative input of amplifier 708, stabilizing the output of amplifier 708 and lowering power supply dependence.

Thus, the use of amplifiers 706, 708 provides a gain-enhanced voltage-follower drive, minimizes the voltage-follower and buffer 716 contention, and provides better edge-rates (sharper rise and fall times for the output signal) and lower input loading for large buffers. Sharper rise and fall times for the output signal lowers power supply dependence in the next symmetric voltage follower buffer circuit (not shown) by ensuring that the circuit threshold voltage is crossed sooner in the next symmetric voltage follower buffer circuit.

Buffer circuit 716 allows the symmetric voltage follower buffer circuit 700 to have a full swing signal output since inverters 712 and 714 are configured in the typical manner (i.e., with the source of p-type transistor connected to Vcc and the source of n-type transistor connected to Vss). Thus, a method and apparatus for a buffer have been described. When the output node 705 reaches Vcc (or gets within Vtn of Vcc) due to buffer circuit 716, n-type transistor 702 will be cut off since the gate to source voltage will be below Vtn. When the output node 705 reaches Vss (or gets within Vtp of Vss) due to buffer circuit 716, p-type transistor 704 will be cut off since the source to gate voltage will be below Vtp. Because amplifiers 706, 708 drive the transistors 702, 704, transistors 702, 704 will be on for a longer duration than transistors 302, 304 in the embodiment of FIG. 2.

It will be understood that the embodiment of FIG. 6 may be further modified. In one embodiment, buffer output impedance may be modulated based on output level through input attenuation circuits 720, 721 that attenuate the input to amplifiers 706, 708 so that the voltage following circuit will be turned "off" beyond a pre-determined voltage swing at the amplifier input. This may be done, for example, by using a simple resistor divider network in the paths to the positive inputs of amplifiers 706, 708. Thus, for example, when the output voltage level crosses above three-fourths Vcc, the first amplifier 706 may be turned off, and when the output voltage level crosses below one-fourth Vcc, the second amplifier 708 may be turned off. Then, only the buffer will be working to achieve full voltage swing.

In another embodiment, input node 701 may be terminated through the use of receiving circuit 724 configured to serve as resistive terminations to the transmission line that delivers the signal to the input of the circuit 701.

These modifications, output level based impedance modulation and input termination, may be implemented separately or together. It will be understood that these modifications could further result in improvements in the transmission of the signals along interconnect wires, such as the minimization of reflections that may give rise to uncertainty in timing (or jitter).

Figure 7:
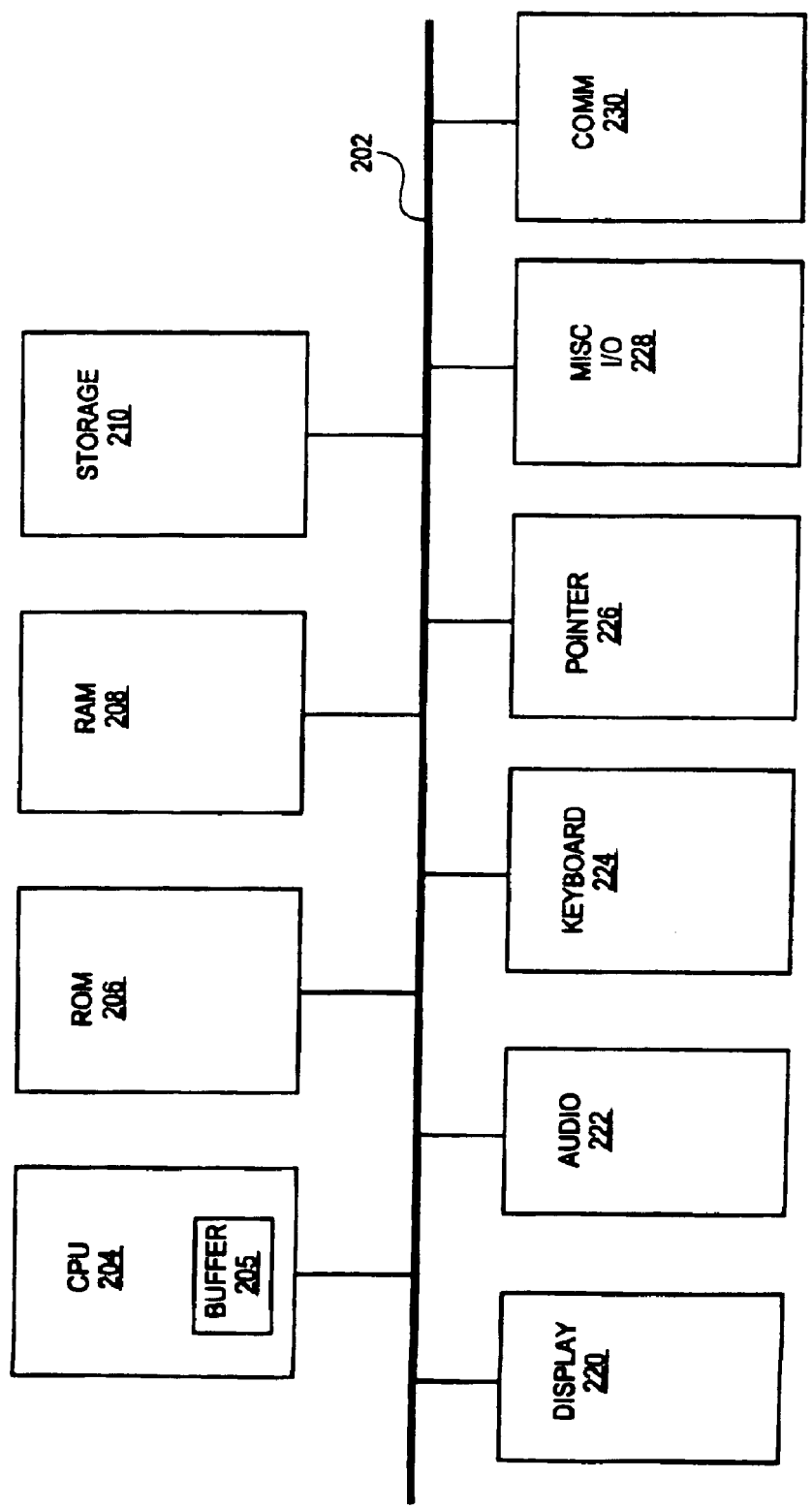
FIG. 7 is a block diagram of a computer system in which the present invention may be used.

FIG. 7 is a block diagram of a computer system. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), etc. The CPU 204 may be a single, multiple, or even a distributed computing resource. The ROM 206 may be any type of non-volatile memory, which may be programmable such as, mask programmable, flash, etc. RAM 208 may be, for example, static, dynamic, synchronous, asynchronous, or any combination. Storage 210, may be Compact Disc (CD), Digital Versatile Disk (DVD), hard disks, optical disks, tape, flash, memory sticks, video recorders, etc. Display 220 might be, for example, a Cathode Ray Tube (CRT), Liquid Crystal Display (LCD), a projection system, Television (TV), etc. Audio 222 may be a monophonic, stereo, three dimensional sound card, etc. The keyboard 224 may be a keyboard, a musical keyboard, a keypad, a series of switches, etc. The pointer 226, may be, for example, a mouse, a touchpad, a trackball, joystick, etc. I/O devices 228, might be a voice command input device, a thumbprint input device, a smart card slot, a Personal Computer Card (PC Card) interface, virtual reality accessories, etc., which may optionally connect via an input/output port 229 to other devices or systems. An example of a miscellaneous I/O device 228 would be a Musical Instrument Digital Interface (MIDI) card. Communications device 230 might be, for example, an Ethernet adapter for local area network (LAN) connections, a satellite connection, a settop box adapter, a Digital Subscriber Line (xDSL) adapter, a wireless modem, a conventional telephone modem, a direct telephone connection, a Hybrid-Fiber Coax (HFC) connection, cable modem, etc. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

The present invention is capable of being embodied in each of the blocks of the computer system described above. Buffer 205 in the CPU 204 may be used, for example, for clock distribution, in phase-locked loops, as drivers for signal distribution buses, as repeaters or in any Very Large Scale Integration (VLSI) chip application.

A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc. Instructions stored on a machine-readable medium may be performed by a set of processors.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

I claim:

1. A circuit comprising:
   a signal input coupled to receive a signal;
   a buffer circuit coupled to receive the signal and to generate a buffer circuit output; and
   a voltage following circuit comprising a first amplifier coupled to a first transistor and a second amplifier coupled to a second transistor, the voltage following circuit coupled to receive the signal and to generate a voltage following output wherein the buffer circuit output and the voltage following circuit output are coupled to a circuit output node,
   wherein the first amplifier comprises a positive input, a negative input and an output, and the first transistor comprises an NMOS transistor including a gate, a source and a drain, the positive input of the first amplifier being coupled to receive the signal, the negative input of the first amplifier being coupled to the source of the NMOS transistor, the output of the first amplifier being coupled to the gate of the NMOS transistor, the drain of the NMOS transistor being coupled to a positive supply voltage, and the source of the NMOS transistor being coupled to the circuit output node, and
   wherein the second amplifier comprises a positive input, a negative input and an output, and the second transistor comprises a PMOS transistor, including a gate, a source and a drain, the positive input of the second amplifier being coupled to receive the signal, the negative input of the second amplifier being coupled to the source of the PMOS transistor, the output of the second amplifier being coupled to the gate of the PMOS transistor, the drain of the PMOS transistor being coupled to a supply voltage less than the positive supply voltage, and the source of the PMOS transistor being coupled to the circuit output node.

2. The circuit of claim 1 wherein the positive input of the first amplifier is coupled to the signal input through a first output level based buffer impedance modulator circuit and the positive input of the second amplifier is coupled to the signal input through a second output level based buffer impedance modulator circuit.

3. The circuit of claim 1 wherein the circuit is part of a signal distribution system.

4. The circuit of claim 3 wherein the circuit is a repeater circuit in the signal distribution system.

5. The circuit of claim 3 wherein the circuit is a second buffer circuit at a distribution junction of the signal distribution system.

6. The circuit of claim 1 wherein the circuit is part of a large scale integrated circuit.

7. A system comprising:
   a microprocessor comprising a circuit including
   a signal input coupled to receive a signal;
   a buffer circuit coupled to receive the signal and to generate a buffer circuit output; and
   a voltage following circuit comprising a first amplifier coupled to a first transistor and a second amplifier coupled to a second transistor, the voltage following circuit coupled to receive the signal and to generate a voltage following output wherein the buffer circuit output and the voltage following circuit output are coupled to a circuit output node,
   wherein the first amplifier comprises a positive input, a negative input and an output, and the first transistor comprises an NMOS transistor including a gate, a source and a drain, the positive input of the first amplifier being coupled to receive the signal, the negative input of the first amplifier being coupled to the source of the NMOS transistor, the output of the first amplifier being coupled to the gate of the NMOS transistor, the drain of the NMOS transistor being coupled to a positive supply voltage, and the source of the NMOS transistor being coupled to the circuit output node, and
   wherein the second amplifier comprises a positive input, a negative input and an output, and the second transistor comprises a PMOS transistor, including a gate, a source and a drain, the positive input of the second amplifier being coupled to receive the signal, the negative input of the second amplifier being coupled to the source of the PMOS transistor, the output of the second amplifier being coupled to the gate of the PMOS transistor, the drain of the PMOS transistor being coupled to a supply voltage less than the positive supply voltage, and the source of the PMOS transistor being coupled to the circuit output node.

8. The system of claim 7 wherein the positive input of the first amplifier is coupled to the signal input through a first output level based buffer impedance modulator circuit and the positive input of the second amplifier is coupled to the signal input through a second output level based buffer impedance modulator circuit.

9. The system of claim 7 wherein the system is part of a signal distribution system.

10. The system of claim 9 wherein the circuit is a repeater circuit in the signal distribution system.

11. The system of claim 9 wherein the circuit is a second buffer circuit at a distribution junction of the signal distribution system.

12. The system of claim 7 wherein the circuit is part of a large scale integrated circuit.

* * * * *